US008422297B2

(12) United States Patent
Tamada

(10) Patent No.: US 8,422,297 B2
(45) Date of Patent: Apr. 16, 2013

(54) MULTI LEVEL INHIBIT SCHEME

(75) Inventor: Satoru Tamada, Kamakura (JP)

(73) Assignee: Micron Technology, Inc., Boise, ID (US)

( * ) Notice: Subject to any disclaimer, the term of this patent is extended or adjusted under 35 U.S.C. 154(b) by 26 days.

(21) Appl. No.: 12/981,688

(22) Filed: Dec. 30, 2010

(65) Prior Publication Data

US 2011/0096599 A1    Apr. 28, 2011

Related U.S. Application Data

(63) Continuation of application No. 12/059,506, filed on Mar. 31, 2008, now Pat. No. 7,864,585.

(30) Foreign Application Priority Data

Feb. 15, 2008  (JP) .................. 2008-034423

(51) Int. Cl.
G11C 16/04  (2006.01)
G11C 11/40  (2006.01)

(52) U.S. Cl.
USPC ............ 365/185.18; 365/185.02; 365/185.03; 365/185.19; 365/185.28

(58) Field of Classification Search ............. 365/185.02, 365/185.03, 185.18, 185.19, 185.28
See application file for complete search history.

(56) References Cited

U.S. PATENT DOCUMENTS

| 6,469,933 | B2 | 10/2002 | Choi et al. |
| 6,714,457 | B1 * | 3/2004 | Hsu et al. .................. 365/185.28 |
| 6,937,518 | B1 * | 8/2005 | Park et al. ................. 365/185.18 |
| 7,020,026 | B2 | 3/2006 | Guterman et al. |
| 7,170,788 | B1 | 1/2007 | Wan et al. |
| 7,206,235 | B1 | 4/2007 | Lutze et al. |
| 7,215,574 | B2 | 5/2007 | Khalid et al. |
| 7,269,068 | B2 | 9/2007 | Chae et al. |
| 7,269,069 | B2 | 9/2007 | Cernea et al. |
| 7,372,754 | B2 | 5/2008 | Hwang et al. |
| 7,411,827 | B2 | 8/2008 | Guterman et al. |
| 7,433,241 | B2 | 10/2008 | Dong et al. |
| 7,440,326 | B2 | 10/2008 | Ito |
| 7,463,531 | B2 | 12/2008 | Hemink et al. |
| 7,468,918 | B2 | 12/2008 | Dong et al. |
| 7,508,715 | B2 | 3/2009 | Lee |
| 7,535,763 | B2 | 5/2009 | Hemink |
| 7,567,460 | B2 | 7/2009 | Chae et al. |
| 7,623,385 | B2 | 11/2009 | Kim et al. |
| 7,656,703 | B2 | 2/2010 | Dong et al. |
| 7,864,585 | B2 * | 1/2011 | Tamada .................... 365/185.18 |

(Continued)

OTHER PUBLICATIONS

Ken Takeuchi, et al. "A Source-line Programming Scheme for Low Voltage Operation NAND Flash Memories", 1999 Symposium on VLSI Circuits Digest of Technical Papers, pp. 37-38.

*Primary Examiner* — Hoai V Ho
*Assistant Examiner* — Jay Radke
(74) *Attorney, Agent, or Firm* — Leffert Jay & Polglaze, P.A.

(57) ABSTRACT

Memory devices and methods are disclosed to facilitate utilization of a multi level inhibit programming scheme. In one such embodiment, isolated channel regions having boosted channel bias levels are formed across multiple memory cells and are created in part and maintained through capacitive coupling with word lines coupled to the memory cells and biased to predetermined bias levels. Methods of manipulation of isolated channel region bias levels through applied word line bias voltages affecting a program inhibit effect, for example, are also disclosed.

27 Claims, 12 Drawing Sheets

U.S. PATENT DOCUMENTS

| | | |
|---|---|---|
| 2004/0105308 A1 | 6/2004 | Matsunaga et al. |
| 2005/0157552 A1* | 7/2005 | Hemink et al. .......... 365/185.03 |
| 2005/0248988 A1 | 11/2005 | Guterman et al. |
| 2005/0248989 A1 | 11/2005 | Guterman et al. |
| 2007/0025155 A1 | 2/2007 | Hwang et al. |
| 2007/0140013 A1 | 6/2007 | Kwon et al. |
| 2008/0019183 A1 | 1/2008 | Chae et al. |
| 2008/0068891 A1 | 3/2008 | Guterman et al. |
| 2008/0130360 A1 | 6/2008 | Kim |
| 2008/0159002 A1 | 7/2008 | Dong et al. |
| 2008/0159003 A1 | 7/2008 | Dong et al. |
| 2008/0159004 A1 | 7/2008 | Hemink et al. |
| 2008/0239806 A1* | 10/2008 | Moschiano et al. ..... 365/185.03 |
| 2008/0291735 A1 | 11/2008 | Dong et al. |
| 2008/0291736 A1 | 11/2008 | Dong et al. |
| 2009/0010067 A1 | 1/2009 | Lee |

\* cited by examiner

MULTI LEVEL INHIBIT SCHEME

RELATED APPLICATION

This application is a continuation of U.S. application Ser. No. 12/059,506, titled "MULTI LEVEL INHIBIT SCHEME," filed Mar. 31, 2008 now U.S. Pat. No. 7,864,585, which is commonly assigned and incorporated herein by reference. The Ser. No. 12/059,506 application further claims priority under 35 U.S.C. §119 of Japanese Application No. 2008-034423, filed on Feb. 15, 2008.

TECHNICAL FIELD

The present disclosure relates generally to memory devices and in particular the present disclosure relates to methods and apparatus for programming memory devices utilizing a multi level inhibit scheme.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data values for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory devices typically use a one-transistor memory cell that allows for high memory densities, high reliability, and low power consumption. Storing data in a flash memory cell can be accomplished by changing the threshold voltage of the cell, through programming (e.g., "writing") a charge storage node (e.g., a floating gate or trapping layers or other physical phenomena). By defining two or more ranges of threshold voltages to correspond to individual data values, one or more bits of information may be stored on each cell. Memory cells storing one bit of data by utilizing two threshold voltage ranges are typically referred to as Single Level Cell (SLC) memory cells. Memory cells storing more than one bit of data per cell by utilizing more than two possible threshold voltage ranges are typically referred to as Multilevel Cell (MLC) memory cells.

Flash memory typically utilizes one of two basic architectures known as NOR flash and NAND flash. The designation is derived from the logic used to read the devices. In NOR flash architecture, a column of memory cells are coupled in parallel with each memory cell coupled to a transfer line, often referred to as a bit line. In NAND flash architecture, a column (e.g., NAND string) of memory cells are coupled in series with only the first memory cell of the column coupled to a bit line.

In both NOR and NAND configurations, memory cells are typically arranged into arrays of rows and columns. The control gates of memory cells of a given row share the same control signal, which is often referred to as a word line. Programming of flash memory cells is accomplished by applying a high programming voltage to the word lines of the memory array in order to shift the threshold voltages of the memory cells. Because the memory cells of a given row are coupled to a common word line, each memory cell is therefore subjected to the high programming voltage applied to the word line. During a programming operation, some memory cells coupled to a given word line may reach their assigned threshold voltage before other memory cells coupled to the same word line reach their assigned threshold voltages. This condition is especially likely to occur in MLC memory. This can cause what is known in the art as program disturb issues which occur when memory cells continue to experience the effects of additional programming pulses after reaching their intended programming or voltage threshold level.

For the reasons stated above, and for other reasons that will become apparent to those skilled in the art upon reading and understanding the present specification, there is a need in the art for alternatives to existing programming schemes for flash memory devices.

DETAILED DESCRIPTION

In the following detailed description of the present embodiments, reference is made to the accompanying drawings that form a part hereof, and in which is shown by way of illustration specific embodiments in which the disclosure may be practiced. These embodiments are described in sufficient detail to enable those skilled in the art to practice the embodiments of the invention, and it is to be understood that other embodiments may be utilized and that process, electrical, mechanical or process changes may be made without departing from the present disclosure. The following detailed description is, therefore, not to be taken in a limiting sense.

MLC technology permits the storage of two or more bits per memory cell, depending on the quantity of threshold voltage ranges assigned to the memory cell and the stability of the assigned threshold voltage ranges during the lifetime operation of the memory cell. The number of threshold voltage ranges, which are sometimes referred to as Vt distribution windows, used to represent a bit pattern comprised of N-bits is $2^N$.

Figure 1:
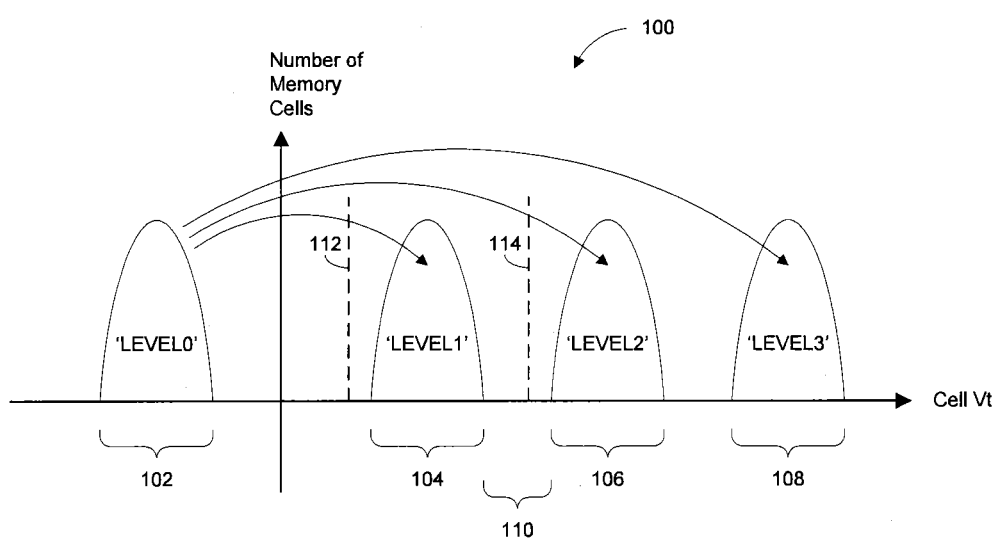
FIG. 1 is a diagram showing threshold voltage distributions levels for a plurality of multiple level memory cells.

FIG. 1 illustrates for example, that a memory cell may be programmed to a Vt that falls within one of four different voltage ranges 100 of 200 mV, each being used to represent a data state corresponding to a bit pattern comprised of two bits. For example, each distribution window 102-108 of FIG. 1 may represent bit values of 11, 10, 00 and 01, respectively. However, the embodiments of the present disclosure are not limited only to these bit patterns. Typically, a dead space 110 (which is sometimes referred to as a margin) of 0.2V to 0.4V is maintained between each range to keep the Vt distribution windows from overlapping. The various embodiments of the present disclosure are not limited only to four data states (e.g., level0, level1, level2 and level3) as shown in FIG. 1.

Figure 2:
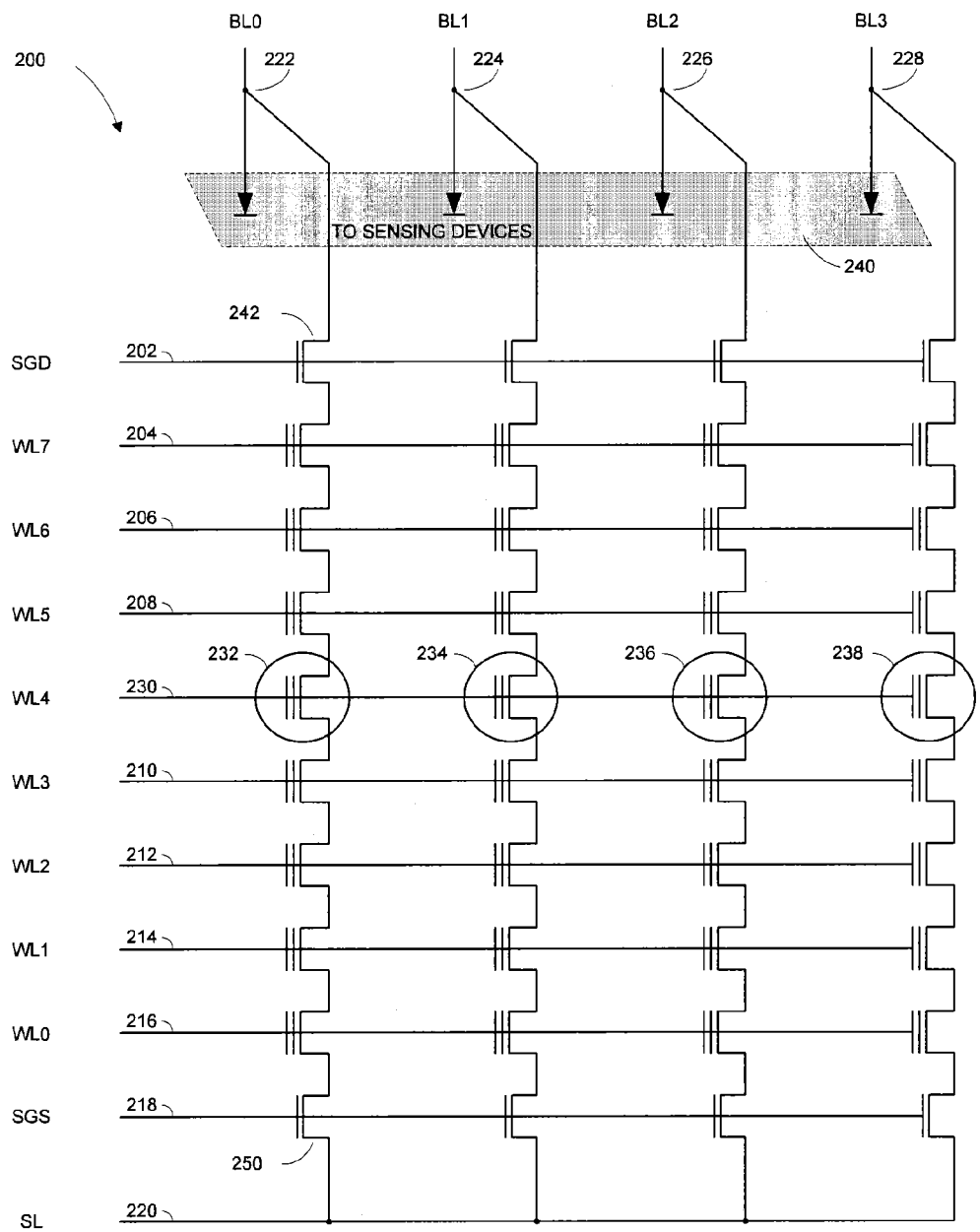
FIG. 2 is a schematic of a NAND memory array according to an embodiment of the disclosure.
Figure 3:
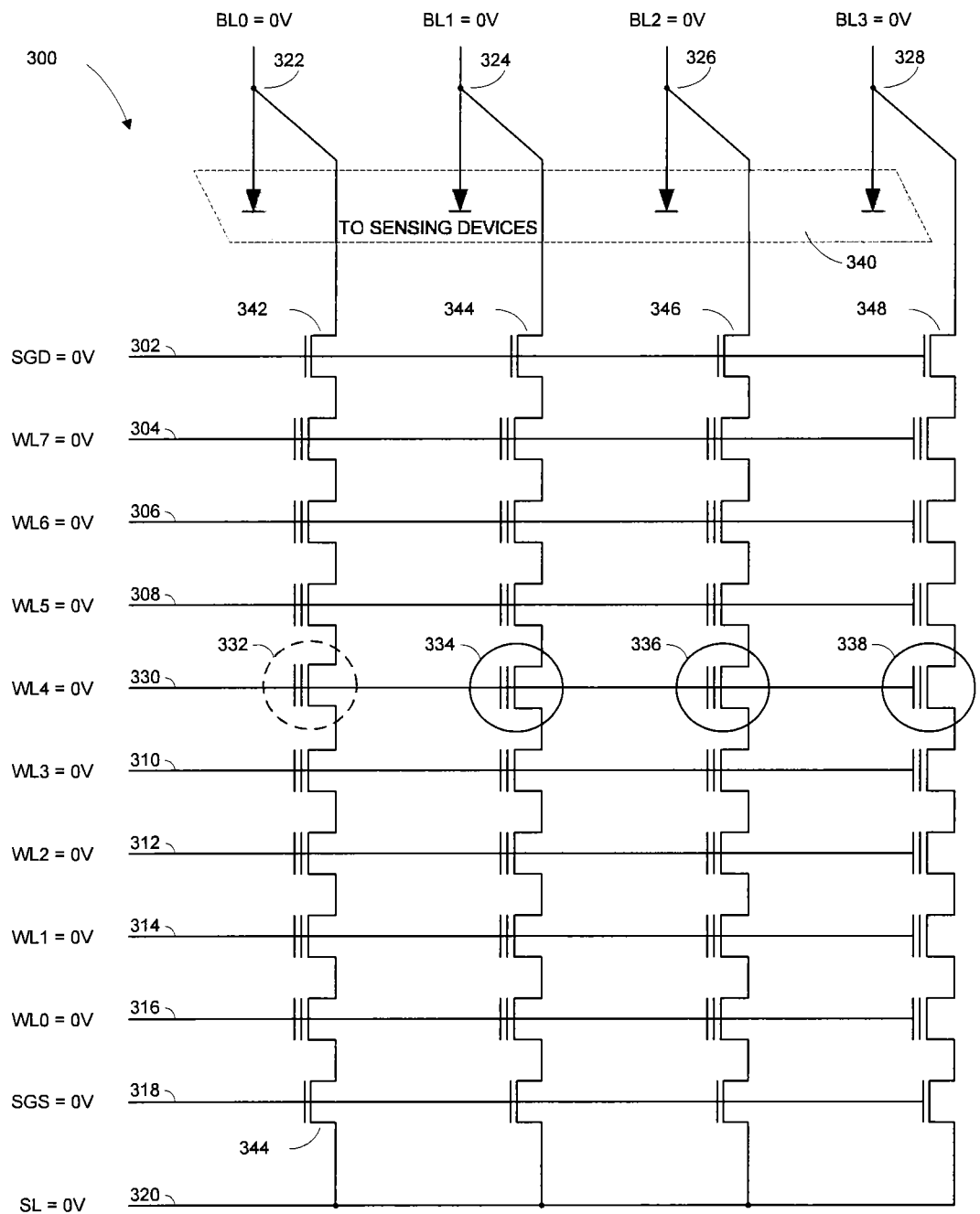
FIG. 3 is a schematic of a NAND memory array under initial bias conditions according to an embodiment of the disclosure.

Flash memory cells are typically arranged in arrays 200 of rows (e.g. memory cells coupled to word lines) and columns coupled to bit lines as shown in FIG. 2. Memory cells 232-238 sharing a common word line 230 are programmed at the same time although potentially to different threshold levels (e.g., levels). NAND strings of flash memory cells are arranged in columns of multiple memory cells, each coupled drain to source as shown in FIG. 2 located between gates 242 and 250. A drain select gate 242 couples one end of the NAND string to an associated bit line BL0 222. A source select gate 250 couples the opposing end of the NAND string to a common source line 220. Each bit line 222-228 is further coupled to sensing devices, e.g., sense amplifiers, 240 (detail not shown.) Sense amplifiers and other sensing devices are known to those skilled in the art and are therefore not discussed further in relation to the various embodiments of the present disclosure.

Flash memory cells are generally erased in blocks wherein all the threshold voltages of the memory cells in the block are returned to a common state. This state is typically referred to as the 'erased,' or level0 102 state as shown in FIG. 1. Flash memory cells are typically programmed a row at a time as indicated by the circled memory cells 232-238 of FIG. 2. Programming is accomplished by providing pulses of a programming voltage to the word line coupled to the row of memory cells to be programmed 232-238. With each programming pulse that is applied, the threshold voltages of the memory cells selected for programming are shifted by some amount. This process continues until the threshold voltages for the memory cells have all reached their intended levels 102-108 as shown in FIG. 1. As discussed above, the memory cells of a row will likely store different data states and thus each memory cell will have different programmed threshold voltages. For example, if the memory cell 234 of FIG. 2 is to be programmed to level1 104 and memory cell 238 is to be programmed to level3 108, then memory cell 238 will typically require more programming pulses to achieve its intended state than memory cell 234. These additional programming pulses needed to complete programming of memory cell 238 in this example can cause a number of issues. One issue is the additional number of pulses increases the programming time required to complete programming of the memory cells for the row of memory being programmed. Further, these additional programming pulses can cause undesirable shifts, often referred to as 'program disturb,' in memory cells of the selected row, and potentially adjacent rows, that have already achieved their intended threshold voltage level. One or more embodiments of the present disclosure provide methods and apparatus to mitigate these program disturb issues and reduce the number of programming pulses needed to complete programming of a given row of memory cells thus reducing the overall time needed to program a row of memory cells.

Programming of memory cells can be accomplished through a process known as Fowler-Nordheim tunneling wherein charges originating in the channel region of the memory cell are forced through an insulating layer where they are then trapped in a charge storage layer (e.g., floating gate.) The more charges that are trapped in the charge storage layer the higher the threshold voltage for the memory cell will be. The rate of charge tunneling is dependent on the potential difference between the programming voltage applied to the control gate and the potential of the channel region of the memory cell. If this gate-to-channel potential is reduced, the programming rate (e.g., programming speed) will be inhibited. One or more embodiments of the present disclosure utilize this characteristic as part of a multi level inhibit scheme in order to adjust the programming speed of memory cells based on the amount of threshold voltage shift that is required by each memory cell. In this manner, such embodiments of the present disclosure facilitate programming of memory cells that require less programming to be programmed slower and memory cells that require more programming (e.g., a greater Vt shift) to be programmed faster. In this manner, such embodiments of the present disclosure provide for the selected memory cells on a common word line to complete programming more closely to the same time regardless of the threshold voltage shift required for each individual memory cell. Thus, such embodiments of the present disclosure address the need to reduce programming time and mitigate disturb issues. Although the following figures address a specific biasing of memory cells in order to illustrate the concepts of the disclosure, other biasing schemes can be used. One or more embodiments of the disclosure utilize varying levels of biasing such that selected memory cells of two or more desired data states experience varying gate-to-channel potentials, i.e., programming potentials, such that they are programmed simultaneously at different rates to facilitate approaching their respective data states at approximately the same time. The variations of gate-to-channel potentials can be accomplished by boosting the channel regions of the selected memory cells coupled to the selected word line to differing levels, depending upon the desired programming speed.

FIGS. 3-9 illustrate an example of a programming operation utilizing a multi level inhibit programming scheme according to one embodiment of the present disclosure. The array of memory cells 300 are shown arranged in four NAND strings of memory cells wherein each NAND string is coupled to its own bit line BL0 322, BL1 324, BL2 326 and BL3 328. As is known in the art, memory arrays can be comprised of many more memory cells, word lines and bit lines than those shown in FIG. 3. In this example, a programming operation is to be performed on the memory cells of word line 4 WL4 330. Memory cell 332 is to be programmed to level0 102 (circled by a dashed line), memory cell 334 to level1 104, memory cell 336 to level2 106 and memory cell 338 to level3 108. Other combinations of programming levels are possible according to the various embodiments of the present disclosure. For example, memory cells 332-338 may all be programmed to the same level (e.g., state) or to any other combination of level0 through levelN states such as states level0-level3 as shown in FIG. 1. The number of potential programming levels according to the various embodiments (e.g., level0-levelN) might be limited by the ability to reliably maintain and differentiate between the N-threshold voltage distributions.

Figure 4:
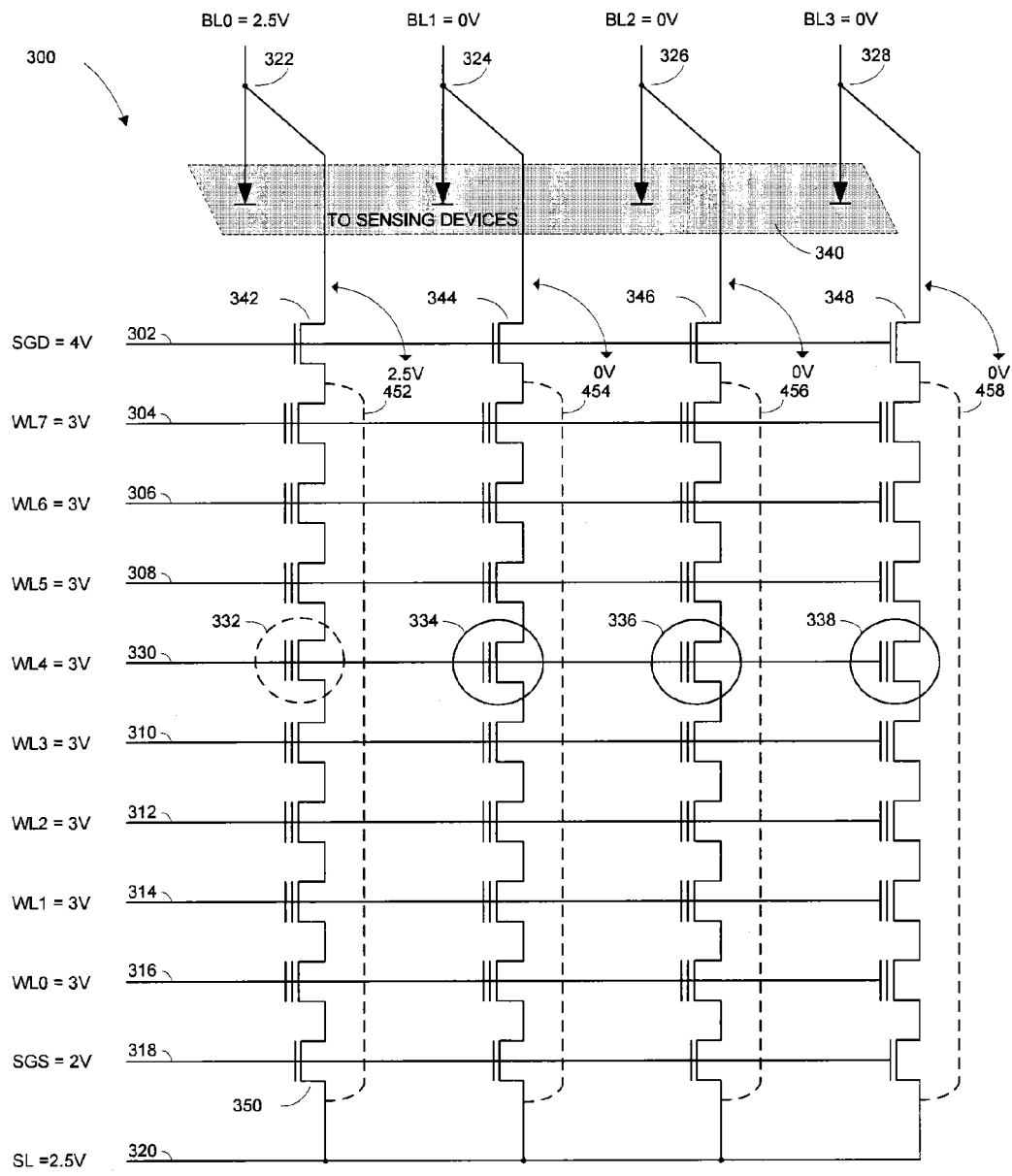
FIG. 4 is a schematic of a NAND memory array subjected to intermediate biasing conditions according to an embodiment of the disclosure.

Again, referring to the example embodiment illustrated in FIGS. 3-9, FIG. 3 illustrates one example of the initial bias conditions of the memory array 300 prior to performing a programming operation utilizing the multi level inhibit scheme of the present embodiment. Other bias voltages are possible, however, according to the various embodiments of the present disclosure. With respect to FIG. 4, the SGD line 302 is biased to approximately 4V to enable drain select gates 342-348 which has the effect of coupling the bias present on the bit lines 322-328 to their respective NAND strings of memory cells. For example, BL0 322 is shown biased at approximately 2.5V wherein the remaining bit lines 324-328 are shown biased at 0V. The 2.5V bias on BL0 serves as a "seed" (which is also sometimes referred to as a "precharge") voltage for the NAND string 322. Also illustrated in FIG. 4 is a common word line bias voltage of approximately 3V applied to word lines 304-316 and 330. This word line bias is referred to as a "Vpass" voltage. The 3V Vpass bias applied to each word line causes a contiguous channel region to form along each of the NAND strings of FIG. 4. These contiguous channel regions 452-458 are illustrated by dotted lines shown along the channel (e.g., active regions) of their respective memory cells. Because the drain select gates 342-348 are enabled by the 4V bias on the SGD line 302, the channel region 452 is charged to 2.5V from BL0 322 and the remaining channels 454-458 are biased at 0V from bit lines 324-328, respectively.

Figure 5:
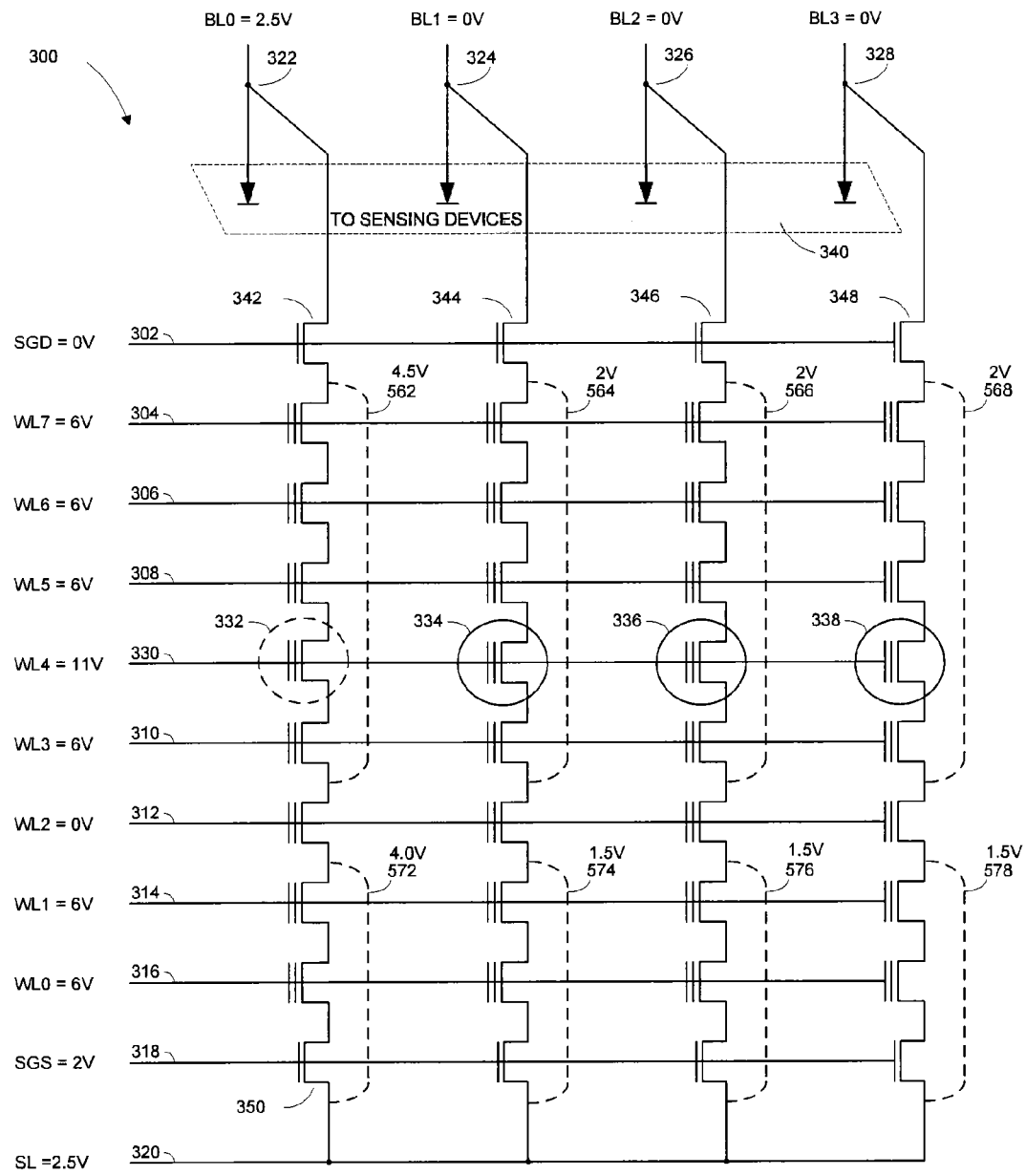
FIG. 5 is a schematic of a NAND memory array subjected to additional intermediate biasing conditions according to an embodiment of the disclosure.

Referring to FIG. 5, SGD 302 is biased to 0V to render the drain select gates 342-348 non-conductive and isolate the channel regions 562-568 from their associated bit lines BL0-BL3, respectively. Word line 2 WL2 312 is also biased to 0V to isolate the channel regions 562-568 from the source line 320. Word lines 304-308 and 310 are biased at a second Vpass voltage of approximately 6V. Other Vpass voltages are possible according to the various embodiments. Word line 4 WL4 330 is biased at a first programming potential of approximately 11V because it contains the memory cells 332-338 that have been selected for programming. As a result of the isolation of the channel regions 562-568, the Vpass bias voltages applied to the word lines 304-308 and 310 and the first programming voltage applied to WL4 330, the channel regions 562-568 are boosted up due to capacitive coupling with their associated word lines. Isolated channel region 562 is boosted up to a potential of approximately 4.5V due in part to the "seed" voltage imposed on the channel illustrated in FIG. 4 and the capacitive coupling of the word lines 304-308, 310 and 330. Isolated channel regions 564-568 are only boosted up to a potential of approximately 2V due only to the capacitive coupling from the word lines 304-308, 310 and 330 because no "seed" voltage was imposed on the regions as in the case of channel region 562. Additional isolated channel regions 572-578 are also formed as a result of the 0V bias potential applied to WL2 312. The first programming potential of 11V applied to WL4 330 causes the channel regions 562-568 to be boosted to a higher potential than channels 572-578. Channels 572-578 are only boosted up by the Vpass voltage of 6V applied to word lines 314 and 316.

Figure 6:
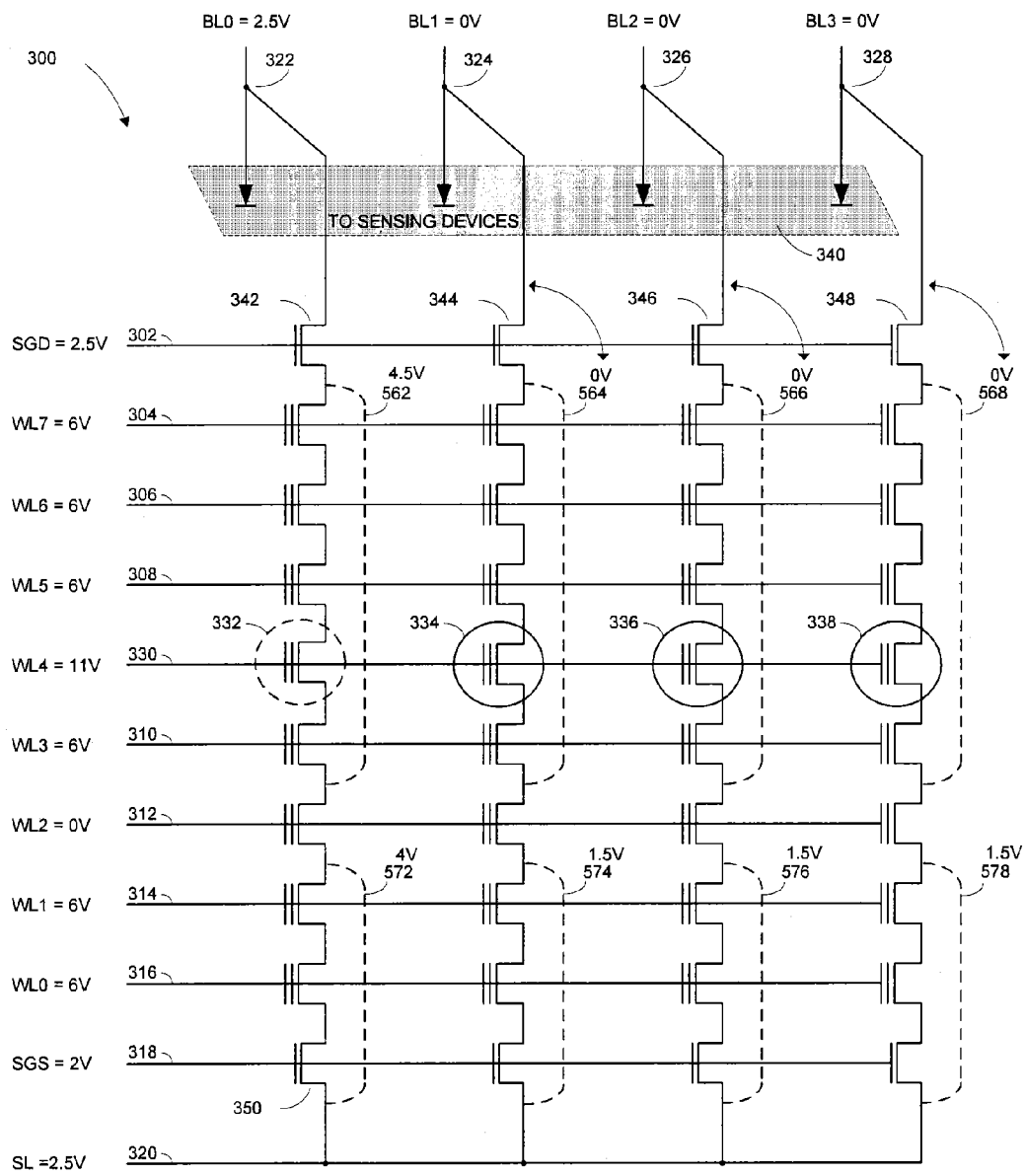
FIG. 6 is a schematic of a NAND memory array subjected to additional intermediate biasing conditions according to an embodiment of the disclosure.

In FIG. 6, memory cells 334, 336 and 338 of the selected word line WL4 330 initially experience the same programming potential even though they are to be programmed to different data states, while memory cell 332 is inhibited from programming. This allows the uninhibited memory cells 334, 336 and 338 to approach the level1 data state at approximately the same rate. Referring to FIG. 6, the SGD line is shown biased to approximately 2.5V. This biases the drain select gates 344-348 into a conductive mode and drives the potentials of channel regions 564-568 to the 0V potentials present on bit lines 324-328. Channel region 562 is not discharged due to the BL0 322 bias of approximately 2.5V which prevents drain select gate 342 from conducting. Channel regions 572-578 remain at the boosted channel potentials as the 0V bias present on WL2 312 continues to isolate these regions. This isolation is maintained in order to reduce a capacitive coupling "loading effect" of having more memory cell channel regions comprising each contiguous isolated channel region than are needed. For example, adding more memory cells to each contiguous isolated channel region 562 would reduce the overall boosted channel region bias level. Word lines nearest the source line 320 and drain select gates 342-348 may be handled differently than other memory cells of the NAND string. While programming may be accomplished using different boosting and isolation techniques, the concepts of varying gate-to-channel potential for selected memory cells to program memory cells of differing desired data states at differing rates can be readily applied to such other boosting and isolation techniques.

Figure 7:
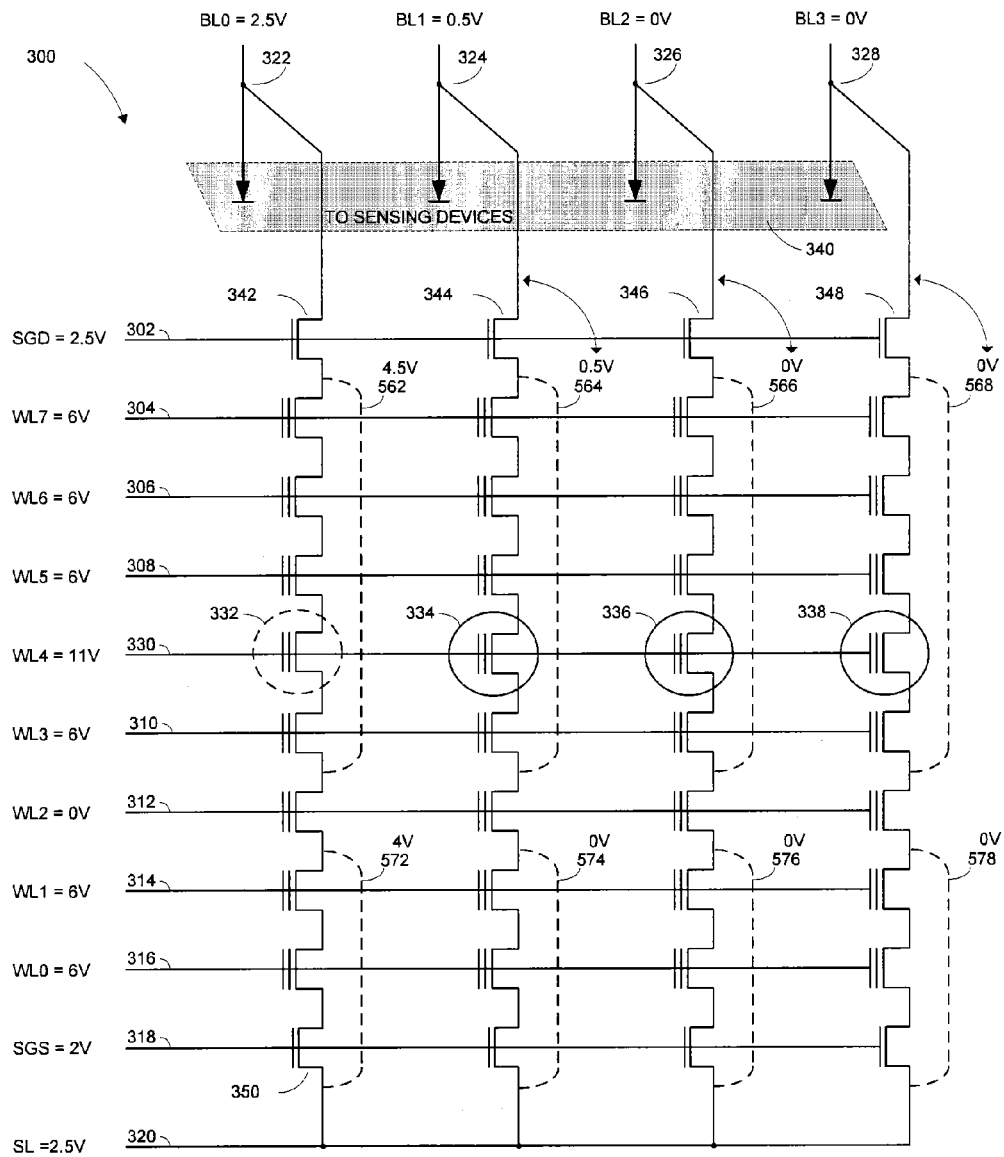
FIG. 7 is a schematic of a NAND memory array subjected to additional intermediate biasing conditions according to an embodiment of the disclosure.

As memory cells are programmed and their programmed level approaches their desired programming level, the associated bitlines of these memory cells are biased such that the programming effect is slowed but not substantially inhibited. For example, in FIG. 1 this slowing effect occurs when a memory cell having a desired programming level of level2 surpasses some threshold level 114 near the desired level2 programming level. FIG. 1 further illustrates a similar threshold level 112 for memory cells having a level1 104 desired programming level. Referring to FIG. 7, as memory cell 334 approaches (e.g., exceeds threshold level 112) its desired level1 data state, its programming potential is altered to reduce (e.g., slow) its programming rate compared to memory cells 336 and 338. This facilitates a slower approach of memory cell 334 to its desired level1 data state while memory cells 336 and 338 continue on to their desired data states. Referring to FIG. 7, bit line 1 BL1 324 which is the associated bit line for the NAND string containing memory cell 334, is biased to a potential of approximately 0.5V. As the drain select gate 344 is in a conductive state, the channel region 564 is elevated to the 0.5V bias of the bit line BL1 324. This 0.5V bias on the channel region 564 will act as a seed voltage for the channel region in a similar manner as the 2.5V seed voltage discussed with respect to channel region 562. Bit lines BL2 326 and BL3 328 remain at a bias of 0V.

Figure 8:
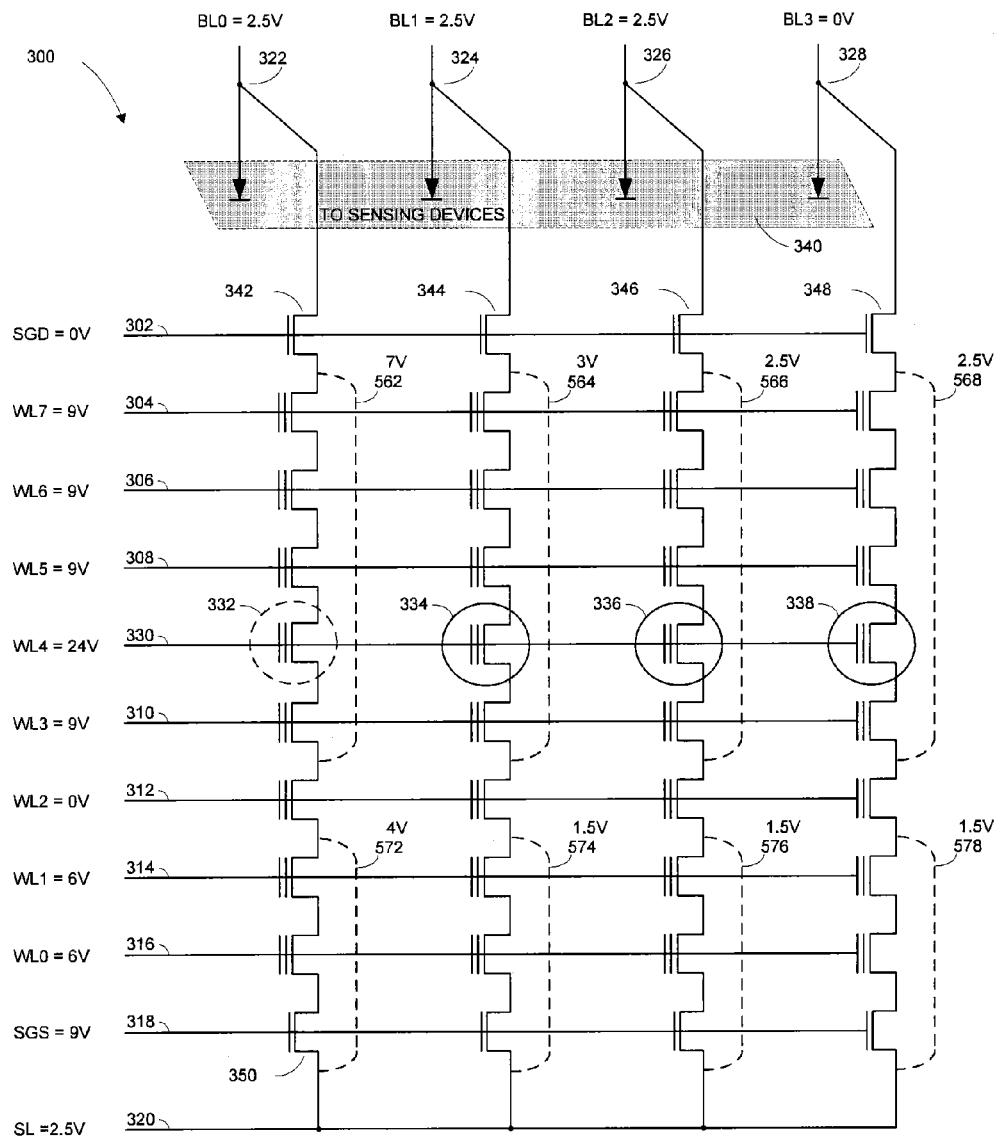
FIG. 8 is a schematic of a NAND memory array subjected to additional intermediate biasing conditions according to an embodiment of the disclosure.

FIG. 8 is an example of preparing conditions for taking selected memory cells to the highest data state in this example embodiment. As the word line potentials rise, the coupled potentials in the channel regions 562-568 also increase. Referring to FIG. 8, the SGD line is biased with a 0V potential thus rendering the drain select gates 342-348 in a non-conductive state. Word line 2 WL2 312 remains at a bias level of 0V to maintain isolation between channel regions 562-568 and channel regions 572-578. The Vpass bias applied to word lines 304-308 and 310 are elevated to approximately 9V and a second programming voltage of approximately 24V is applied to word line 330. The increase in the Vpass and programming voltages causes a higher boosted bias level in each of the isolated channel regions 562-568. For example, the isolated channel region 562 is boosted to approximately 7V, isolated channel region 564 is boosted to approximately 3V and isolated channel regions 566 and 568 are boosted to approximately 2.5V. Note, the boosted channel region 564 is approximately 0.5V greater than the channel region bias of channels 566 and 568 due to the seed voltage of 0.5V imposed on bit line BL1 324 discussed with respect to FIG. 7 above.

Figure 9:
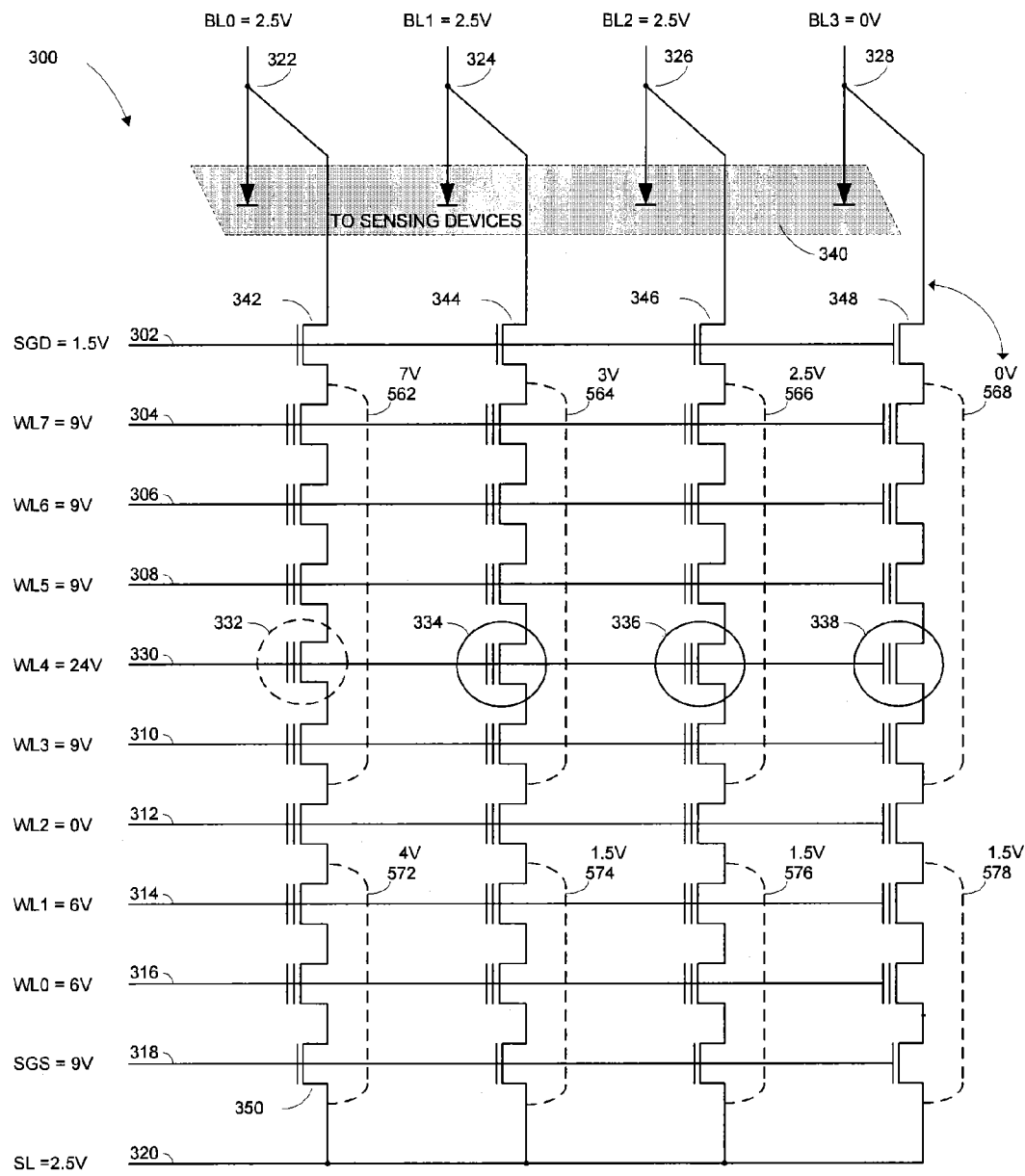
FIG. 9 is a schematic of a NAND memory array subjected to final biasing conditions according to an embodiment of the disclosure.

In FIG. 9, the channel region 568 is brought to ground to increase the programming rate of memory cell 338 as compared to memory cells 334 and 336. This facilitates a regulated approach of memory cells 334 and 336 to their desired data states while memory cell 338 continues on to its desired data state. Note that although the programming potentials are altered from the prior phase of programming, the programming potentials for level1 and level2 memory cells need not be reduced in order to provide a slower programming speed than level3 memory cells. It is the effective programming potentials applied to memory cells that will determine their relative programming speeds. Referring to FIG. 9, the SGD line is biased to approximately 1.5V, bit lines BL0-BL2 322-326 are biased at approximately 2.5V and bit line BL3 328 is biased at approximately 0V. This biasing condition of the SGD line and bit lines BL0-BL3 result in only drain select gate 348 being set to a conductive state. As a result, the boosted channel region 568 coupled to BL3 328 by drain select gate 348 is discharged to the BL3 potential of 0V. Channel regions 562-566, isolated from their respective bit lines by drain select gates 342-346 respectively, remain at their boosted channel potentials of approximately 7V, 3V and 2.5V respectively as illustrated in FIG. 9. Thus, the boosted channel regions 562-566 are elevated in part and maintained by capacitive coupling from the word lines alone without support from their associated bit lines. In addition, according to the various embodiments, providing a seed voltage prior to isolation of a channel region allows for higher isolated channel bias levels to be achieved and maintained through capacitive coupling with the associated word lines. This should provide the additional benefit of not having to provide multiple and potentially high voltages on the bit lines of the memory array in order to inhibit programming.

After applying this final programming pulse, a verification process is performed to verify whether each selected memory cell has reached its respective desired data state. For each memory cell reaching its desired data state, a register can be set to indicate that no further programming is desired. These memory cells would receive biasing to be fully inhibited during subsequent iterations of the programming operation as described with reference to FIGS. 3-9. As such, they would be treated the same as memory cell 332 as the programming operation is repeated to drive remaining memory cells to their desired data states. The process described with reference to FIGS. 3-9 may be repeated until each memory cell on a selected word line reaches its desired data state, or a failure may be indicated if one or more memory cells fail to reach their desired data states in a particular number of attempts.

Table 1 includes the resulting bias conditions of the embodiment of the present disclosure illustrated in FIG. 9. As discussed above, the programming rate is dependent on the potential difference between the word line programming voltage and the potential of the channel region of the memory cell being programmed. A higher effective programming potential will result in an increase in the programming speed of the memory cell. Again with reference to FIG. 1, the threshold voltage of a memory cell to be programmed to a level3 108 state must shift further than a memory cell to be programmed to a level1 104 or level2 106 state. Thus, the memory cells requiring the greatest shift in threshold voltage can be programmed faster then memory cells requiring a lesser shift in threshold voltage during a programming operation. Table 1 includes the "Intended Programming Level" for each memory cell 332-338 of the example programming operation according to the embodiment of the present disclosure illustrated in FIG. 9. From Table 1 it can be seen that the memory cell which requires the greatest shift in threshold voltage (e.g., level3) is memory cell 338. It can be seen also from Table 1 that the embodiment of the present disclosure illustrated in FIGS. 3-9 applies a greater effective programming potential to memory cells requiring a greater shift (e.g., faster programming) in threshold voltage (e.g., level3) then memory cells requiring less threshold voltage shifts (e.g., level1, level2.) For example, according to Table 1, memory cell 338 will experience an effective programming potential of approximately 24V wherein the memory cell 334 experiences an effective programming potential of approximately 21V. Thus, memory cell 338 will be programmed faster than memory cell 334. Although memory cell 332 experiences an effective programming potential of approximately 17V, the programming speed is significantly inhibited resulting in a minimal shift in the threshold voltage of the memory cell. The method of the present embodiment therefore provides for a programming operation wherein the memory cells of a given word line complete programming more closely in time. The methods of such embodiments should also result in the reduction of program disturb issues due to a reduction in the amount of programming pulses applied to the array.

TABLE 1

Resulting Bias Conditions

| Memory Cell | Intended programming level | Slow programming rate if current programmed level is: | Final applied programming voltage (WL4) | Final boosted bias level on isolated channel region | Effective programming potential on memory cell |
|---|---|---|---|---|---|
| 332 | level0 | *** | 24 V | 7 V | 17 V |
| 334 | level1 (or level2) | >Level 112 (>Level 114) | 24 V | 3 V | 21 V |
| 336 | level2 (or level 1) | <Level 114 (<Level 112) | 24 V | 2.5 V | 21.5 V |
| 338 | level3 | *** | 24 V | 0 V | 24 V |

Figure 10:
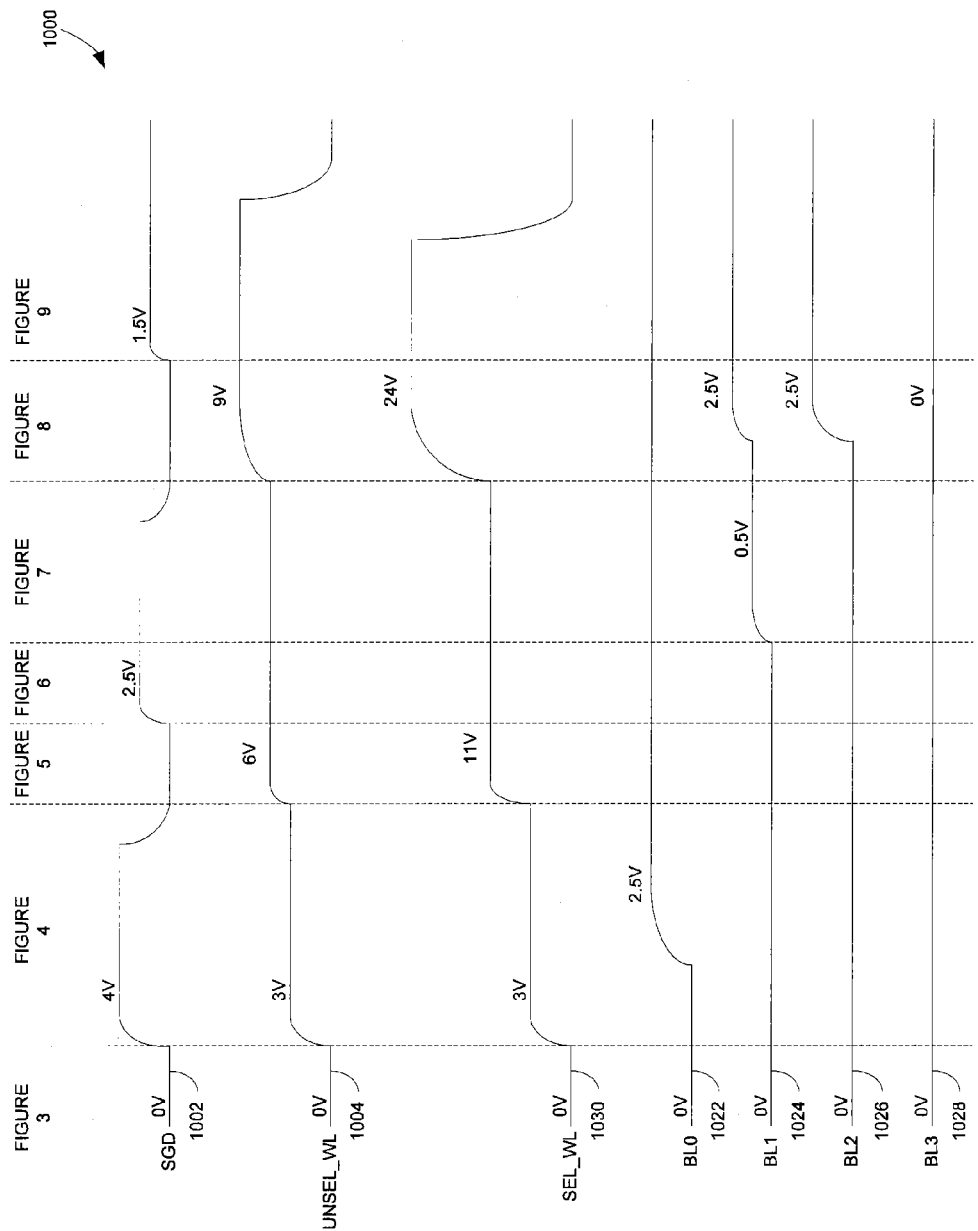
FIG. 10 is a plot of waveforms applied to a NAND memory array according to an embodiment of the disclosure.

FIG. 10 illustrates some of the biasing waveforms 1000 applied to the array of memory cells 300 as illustrated throughout and with reference to FIGS. 3-9. Waveform SGD 1002 corresponds to SGD line 302 of FIGS. 3-9. Waveform UNSEL_WL 'unselected word line' 1004 corresponds to the word lines 304-308 and 310 not selected for programming as illustrated in FIGS. 3-9. Waveform SEL_WL 'selected word line' 1030 corresponds to the word line 330 selected for programming in FIGS. 3-9. BL0-BL3 1022-1028 respectively, correspond to BL0-BL3 322-328 as illustrated in FIGS. 3-9. The various embodiments of the present disclosure are not however limited only to the waveform levels and relative timing of each waveform as shown in FIG. 10. Other biasing waveform levels, transitions and relative timing are possible according to the various embodiments of the present disclosure.

Figure 11:
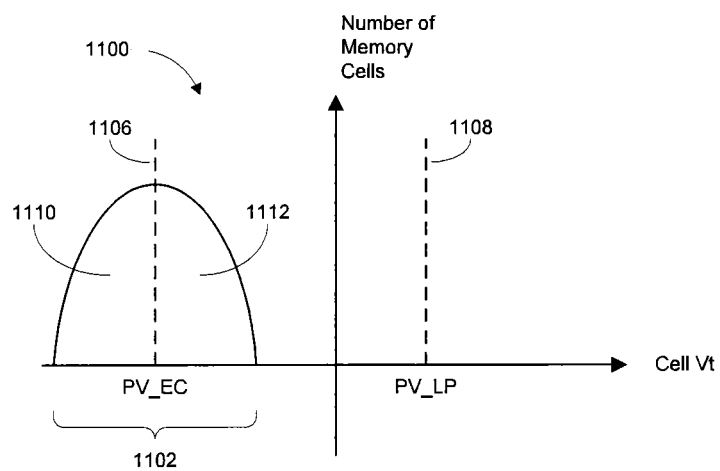
FIG. 11 is a diagram showing threshold voltage distributions for a block of memory cells following an erase operation having been performed on the memory cells.

An additional embodiment of the present disclosure is illustrated by reference to FIGS. 11 and 12. Such an embodiment could be utilized to perform an 'erase compaction' operation on a block of memory cells by utilizing a multi level inhibit scheme according to one or more embodiments of the present disclosure. Prior to programming a block of flash memory, an erase operation is performed on the block of memory cells wherein the threshold voltage levels of the memory cells are adjusted to a common distribution. For example, the level0 distribution 102 shown in FIG. 1 is typically considered the 'erased' state for a block of flash memory cells. Referring to FIG. 11, the distribution 1102 represents a block of memory cells that have undergone an erase operation. However, after an erase operation has been completed, some memory cells may be 'over-erased' 1110 compared to other cells 1112 resulting in a wider than desired distribution of threshold voltages 1102. An erase compaction operation can be performed in order to reduce the distribution window width of the erased memory cells prior to performing additional programming operations on the memory cells. This can be accomplished by not fully inhibiting the over-erased memory cells of a word line during programming of other memory cells coupled to that word line. For example, with reference to FIG. 9, instead of developing a 17V programming potential for memory cell 332, a 19V programming potential could be developed. This would permit some shift in threshold voltage of memory cell 332, but would not result in the same level of programming as those memory cells intended to reach level1, level2 or level3 data states. This reduced shift will result in compaction of the partially-inhibited level0 memory cells.

Memory cells undergoing a programming operation, or erase compaction operation, have a programming pulse applied which is typically followed by a verification operation to determine if the memory cell has been programmed to exhibit the desired threshold voltage. This can be accomplished by comparing the threshold voltage of the memory cell with a particular verification threshold level. For example, PV_EC 1106 and PV_LP 1108 as shown in FIG. 11. In order to perform the programming operation to achieve either the erase compacted distribution 1202 or the level 1 programming distribution 1204 shown in FIG. 12, a programming voltage is appropriately inhibited and applied according to one or more of the various embodiments of the present disclosure. The programming operation is followed by a verification operation to determine if the memory cell meets the PV_EC verification limit 1106 in the case of the erase compaction operation or meets the PV_LP verification limit 1108 in the case of the level1 programming operation 1214. If the appropriate verification level in either case has not been achieved, additional programming operations are performed.

Figure 12:
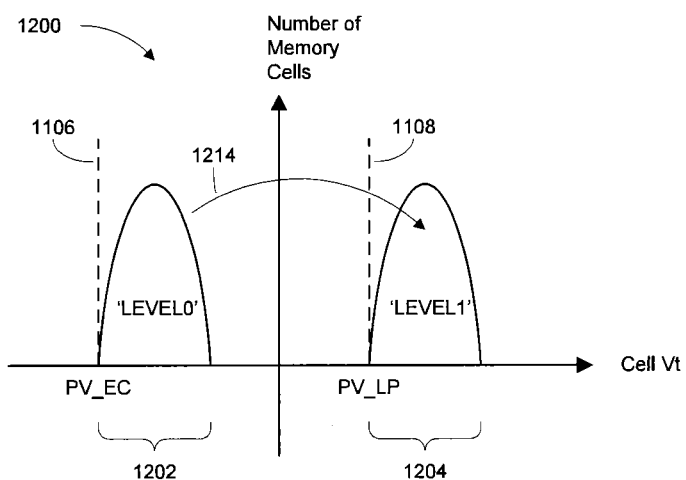
FIG. 12 is a diagram showing threshold voltage distributions for memory cells undergoing an erase compaction and programming operation according to an embodiment of the disclosure.

Memory cells in the 1110 portion of distribution 1102 are in need of additional processing (e.g., erase compaction) in order to shift their threshold voltages towards the distribution 1202 shown in FIG. 12 and therefore satisfying the PV_EC verification level 1106. Memory cells of FIG. 11 shown in distribution 1112 already meet the PV_EC verification level 1106 and require no further processing. Thus, an erase compaction operation performed according to one or more of the embodiments of the present disclosure is utilized to shift the 'over erased' memory cells 1110 to satisfy the PV_EC verification level 1106 without affecting the threshold voltages of the memory cells in the 1112 distribution. This compaction operation is performed during the programming of remaining memory cells to their respective desired data states. For one embodiment, memory cells in the 1112 portion of distribution 1102 are fully inhibited during the process described with reference to FIGS. 7-9 as the word line potentials are increased.

Figure 13:
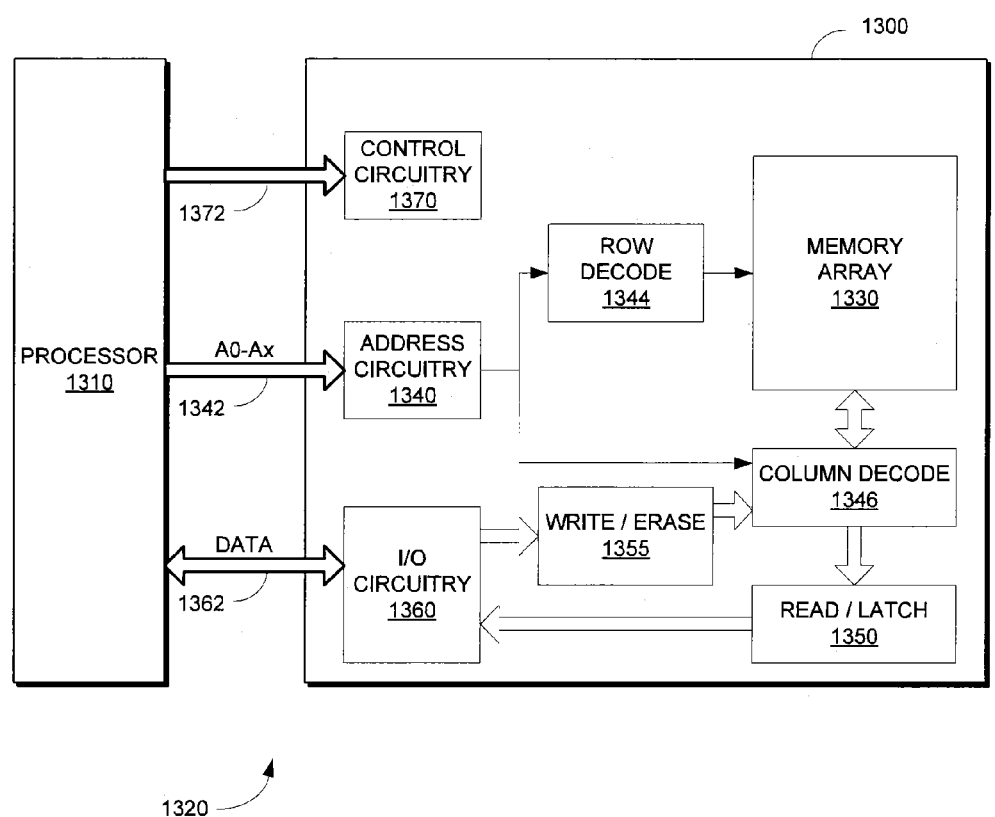
FIG. 13 is a functional block diagram of an electronic system having at least one memory device according to an embodiment of the present disclosure.

FIG. 13 is a functional block diagram of an electronic system having at least one memory device 1300 according to an embodiment of the present disclosure. The memory device 1300 is coupled to a processor 1310. The processor 1310 can be a microprocessor or some other type of controlling circuitry. The memory device 1300 and the processor 1310 form part of an electronic system 1320. The memory device 1300 has been simplified to focus on features of the memory that are helpful in understanding the present disclosure.

The memory device includes an array of memory cells 1330 that can be arranged in banks of rows and columns.

An address buffer circuit 1340 is provided to latch address signals provided on address input connections A0-Ax 1342. Address signals are received and decoded by a row decoder 1344 and a column decoder 1346 to access the memory array 1330. It will be appreciated by those skilled in the art, with the benefit of the present description, that the number of address input connections depends on the density and architecture of the memory array 1330. That is, the number of addresses increases with both increased memory cell counts and increased bank and block counts.

The memory device 1300 reads data in the memory array 1330 by sensing voltage or current changes in the memory array columns using a sensing device, such as sense/data cache circuitry 1350. The sense/data cache circuitry 1350, in one embodiment, is coupled to read and latch a row of data from the memory array 1330. Data input and output buffer circuitry 1360 is included for bi-directional data communication over a plurality of data connections 1362 with the controller 1310. Write circuitry 1355 is provided to write data to the memory array 1330.

Control circuitry 1370 is comprised in part of the various structures or features of one or more embodiments of the present disclosure. For example, control circuitry 1370 can include a state machine and/or various control registers. Control signals and commands can be sent to the memory device over the command bus 1372. The command bus 1372 may be a discrete signal or may be comprised of multiple signals (e.g., a command bus). These command signals 1372 are used to control the operations on the memory array 1330, including data read, data write (program), and erase operations.

The memory device illustrated in FIG. 13 has been simplified to facilitate a basic understanding of the features of the electronic system. A more detailed understanding of internal circuitry and functions of memories are known to those skilled in the art.

CONCLUSION

Memory devices and methods have been described capable of providing a multi level inhibit scheme that can be utilized during a programming operation. By utilizing isolated channel regions boosted in part to various bias levels and further maintained through capacitive coupling with biased word lines, the programming speed can be selectively inhibited. This can allow multiple memory cells undergoing programming to different threshold levels to complete programming at substantially the same time and with a reduction of programming disturb effects.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device, the method comprising:
    programming a first memory cell at a first programming rate to adjust a threshold voltage of the first memory cell to a first desired threshold voltage; and
    programming a second memory cell at a second programming rate to adjust a threshold voltage of the second memory cell to a second desired threshold voltage wherein the second programming rate is different than the first programming rate;
    wherein at least the first programming rate is regulated exclusively by capacitive coupling a channel potential to a channel region of the first memory cell;
    wherein programming the first memory cell at the first programming rate and programming the second memory cell at the second programming rate comprises applying a particular potential to a gate of the first memory cell and a gate of the second memory cell while maintaining a channel region of the first memory cell and a channel region of the second memory cell at different channel potentials; and
    wherein the channel region of the first memory cell is isolated from a bit line associated with the channel region of the first memory cell while programming the first memory cell at the first programming rate.

2. The method of claim 1, wherein programming the second memory cell further comprises programming the second memory cell where the second programming rate is regulated exclusively by capacitive coupling, and wherein the channel region of the second memory cell is isolated from a bit line associated with the channel region of the second memory cell while programming the second memory cell at the second programming rate.

3. The method of claim 1, wherein the first and the second memory cells achieve their respective first and second desired threshold voltages at substantially the same time.

4. The method of claim 1, wherein the first desired threshold voltage is representative of a first desired data state of the first memory cell and the second desired threshold voltage is representative of a second desired data state of the second memory cell.

5. The method of claim 1, further comprising programming the first memory cell at a third programming rate to adjust the threshold voltage of the first memory cell to a third desired threshold voltage after adjusting the threshold voltage of the first memory cell to the first desired threshold voltage.

6. The method of claim 5, wherein the third programming rate is slower than the first programming rate.

7. The method of claim 6, wherein the first desired threshold voltage comprises a verify threshold voltage and the third desired threshold voltage comprises a final threshold voltage.

8. The method of claim 7, wherein the final threshold voltage represents a desired data state of the first memory cell.

9. The method of claim 5, further comprising programming the second memory cell at a fourth programming rate to a fourth desired threshold voltage after adjusting the threshold voltage of the second memory cell to the second desired threshold voltage.

10. The method of claim 9, wherein the fourth programming rate is slower than the second programming rate.

11. The method of claim 1, wherein the second programming rate is regulated by coupling a channel region of the second memory cell to a line biased to a particular bias potential.

12. The method of claim 11, wherein the particular bias potential comprises a ground potential.

13. A method of operating a memory device comprising a plurality of memory cells selected for programming during a programming operation, the method comprising:
    regulating a first programming speed of a first memory cell to be programmed to a first desired threshold voltage during the programming operation; and
    regulating a second programming speed of a second memory cell to be programmed to a second desired threshold voltage during the programming operation;
    wherein the first programming speed is regulated by maintaining a first effective programming potential on the first memory cell exclusively by capacitive coupling a first channel potential to a channel region of the first memory cell;
    wherein the second programming speed is regulated by maintaining a second effective programming potential on the second memory cell exclusively by capacitive coupling a second channel potential to a channel region of the second memory cell;
    wherein the first channel potential is different than the second channel potential;
    wherein the first effective programming potential is different than the second effective programming potential; and
    wherein the channel region of the first memory cell is isolated from a bit line associated with the channel region of the first memory cell while regulating the first programming speed and the channel region of the second memory cell is isolated from a bit line associated with the channel region of the second memory cell while regulating the second programming speed.

14. The method of claim 13, wherein regulating the first programming speed and regulating the second programming speed further comprises applying a programming voltage to a control gate of the first memory cell commonly coupled with a control gate of the second memory cell.

15. The method of claim 14, wherein the first and the second effective programming potentials comprise a control gate to channel potential of the first and the second memory cells, respectively.

16. The method of claim 14, wherein regulating the first programming speed and regulating the second programming speed further comprises changing the first programming speed and/or the second programming speed while applying the programming voltage.

17. The method of claim 13, wherein regulating the first programming speed and regulating the second programming speed further comprises changing the first programming speed and/or the second programming speed during a programming operation performed on the first and/or the second memory cell.

18. The method of claim 17, further comprising changing the first and/or the second programming speed responsive to the first and/or the second memory cell approaching its first or second desired threshold voltages, respectively.

19. The method of claim 18, wherein changing the first and/or second programming speeds further comprises decreasing the programming speed of the first and/or the second memory cell responsive to the first and/or the second memory cell threshold voltages approaching the first and/or second desired threshold voltages, respectively.

20. The method of claim 13, further comprising inhibiting the first and/or the second memory cell from programming when the first and/or the second memory cell achieves the first and the second desired threshold voltages, respectively.

21. A memory device, comprising:
    an array of memory cells; and control circuitry, wherein the control circuitry is configured to:

program a first memory cell at a first programming rate, to adjust a threshold voltage of the first memory cell to a first desired threshold voltage, by maintaining a channel region of the first memory cell at a first channel potential while applying a particular potential to a gate of the first memory cell; and program a second memory cell at a second programming rate, to adjust a threshold voltage of the second memory cell to a second desired threshold voltage, by maintaining a channel region of the second memory cell at a second channel potential while applying the particular potential to a gate of the second memory cell, wherein the second programming rate is different than the first programming rate and wherein the second channel potential is different than the first channel potential;

wherein at least the first programming rate is regulated exclusively by capacitively coupling the first channel potential to the channel region of the first memory cell; and wherein the channel region of the first memory cell is isolated from a bit line associated with the channel region of the first memory cell while the first memory cell is being programmed at the first programming rate.

22. The memory device of claim 21, wherein the control circuitry is further configured to regulate the second programming rate exclusively by capacitive coupling, wherein the channel region of the second memory cell is isolated from a bit line associated with the channel region of the second memory cell while the second memory cell is being programmed at the second programming rate.

23. The memory device of claim 21, wherein the control circuitry is further configured to change the first programming rate when the threshold voltage of the first memory cell has been adjusted to the first desired threshold voltage.

24. The memory device of claim 21, wherein the control circuitry is further configured to program the first memory cell at a third programming rate slower than the first programming rate after the first memory cell has been adjusted to the first desired threshold voltage.

25. The memory device of claim 24, wherein the control circuitry is further configured to program the first memory cell at the third programming rate to adjust the threshold voltage of the first memory cell to a third desired threshold voltage.

26. The memory device of claim 25, wherein the third desired threshold voltage corresponds to a desired programmed data state of the first memory cell.

27. The method of claim 1, wherein the channel region of the second memory cell is coupled to a bit line associated with the channel region of the second memory cell while programming the second memory cell at the second programming rate.

* * * * *